US012562227B2

(12) United States Patent　　　　(10) Patent No.:　US 12,562,227 B2
Paolini et al.　　　　　　　　　　　(45) Date of Patent:　Feb. 24, 2026

(54) VOLTAGE REGULATOR SUPPLY FOR INDEPENDENT WORDLINE READS

(71) Applicant: Micron Technology, Inc., Boise, ID (US)

(72) Inventors: Federica Paolini, Francavilla al Mare (IT); Violante Moschiano, Avezzano (IT); Marco Domenico Tiburzi, Avezzano (IT); Leo Raimondo, Avezzano (IT); Filippo Bruno, Padua (IT); Shigekazu Yamada, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 212 days.

(21) Appl. No.: 18/489,454

(22) Filed: Oct. 18, 2023

(65) Prior Publication Data

US 2024/0135994 A1　　　Apr. 25, 2024
US 2024/0233825 A9　　　Jul. 11, 2024

Related U.S. Application Data

(60) Provisional application No. 63/418,365, filed on Oct. 21, 2022.

(51) Int. Cl.
*G11C 16/08*　　　(2006.01)
*G11C 16/04*　　　(2006.01)
*G11C 16/26*　　　(2006.01)
*G11C 16/30*　　　(2006.01)

(52) U.S. Cl.
CPC .......... *G11C 16/08* (2013.01); *G11C 16/0483* (2013.01); *G11C 16/26* (2013.01); *G11C 16/30* (2013.01)

(58) Field of Classification Search
CPC ..... G11C 16/08; G11C 16/0483; G11C 16/26; G11C 16/30; G11C 7/227; G11C 16/32; G11C 16/3427; G11C 5/147
See application file for complete search history.

(56) References Cited

U.S. PATENT DOCUMENTS

| | | | |
|---|---|---|---|
| 8,363,466 B2 * | 1/2013 | Shinozaki .......... | G11C 16/0483 |
| | | | 365/185.26 |
| 2005/0232013 A1 * | 10/2005 | Kawai .................... | G11C 16/30 |
| | | | 365/185.18 |
| 2019/0258404 A1 * | 8/2019 | Rajwade ................. | G06F 13/42 |
| 2023/0090202 A1 * | 3/2023 | Fujimori ............ | G11C 16/3445 |
| | | | 365/185.11 |

* cited by examiner

*Primary Examiner* — Uyen Smet
(74) *Attorney, Agent, or Firm* — Lowenstein Sandler LLP

(57)　　　　　ABSTRACT

A system includes a memory device having one or more planes and a first set of voltage regulators coupled to each plane of the one or more planes, where the first set of voltage regulators is shared by the one or more planes. The system includes a second set of voltage regulators coupled to a plane of the one or more planes configured to supply a respective voltage to one or more conductive lines responsive to a memory access operation request. The system includes a switch, at the plane of the one or more planes, coupled with a first voltage regulator of the first set of voltage regulators, a second voltage regulator of the second set of voltage regulators, and a first conductive line, the switch configured to selectively couple the second voltage regulator of the second set of voltage regulators to the first conductive line.

19 Claims, 7 Drawing Sheets

Selected Wordline 350

Switch 305

Regulator 225-a

Unselected Wordline 355

Switch 310

Regulator 225-b

Switch 315

Dummy Wordline 360

Switch 245-a

Regulator 210-a

Switch 320

Dummy Wordline 365

Switch 245-b

Regulator 210-b

Switch 325

SGS 370

Switch 245-c

Regulator 210-c

Switch 330

SGD 375

Switch 245-d

Regulator 210-d

300

500

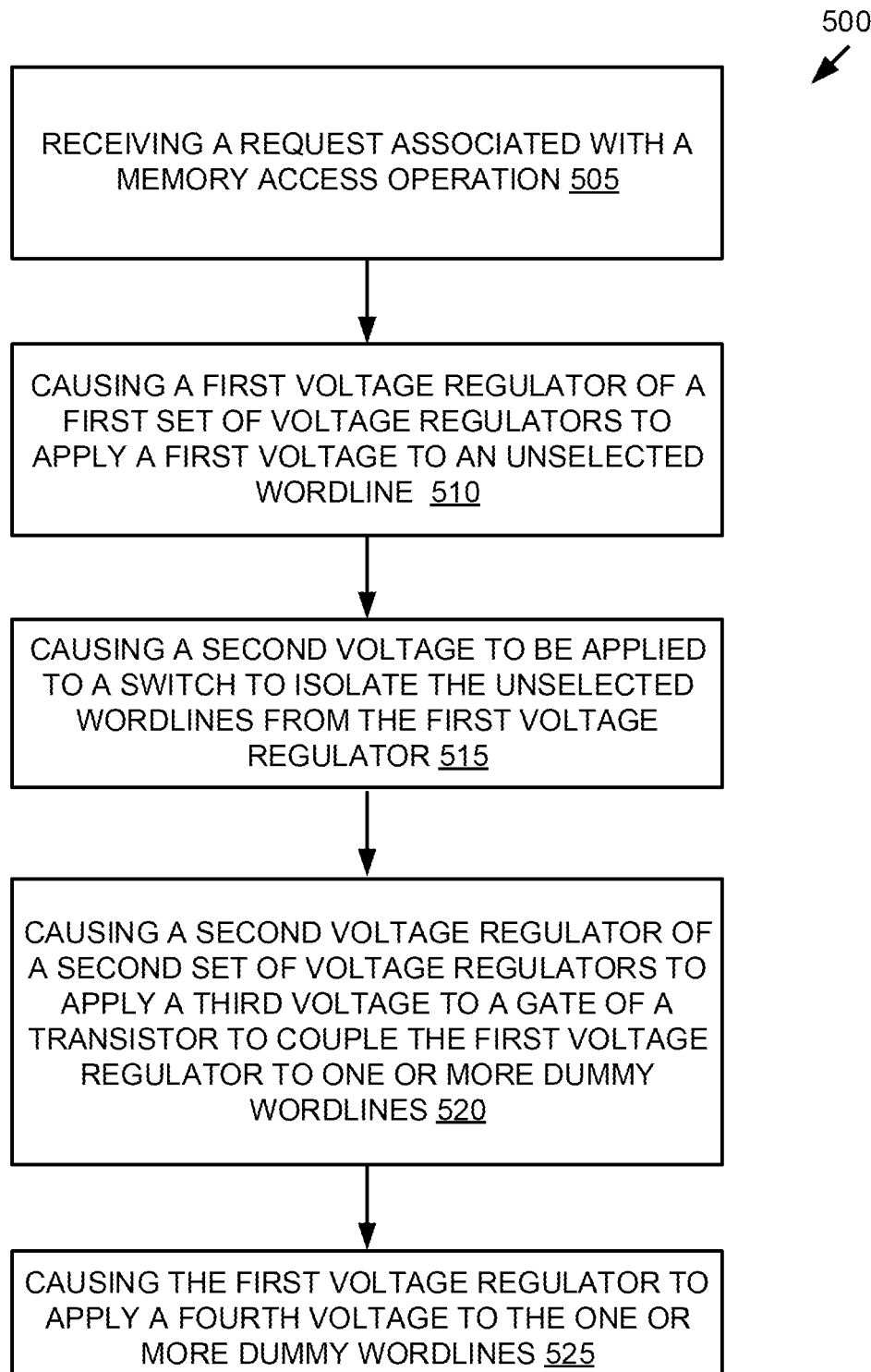

RECEIVING A REQUEST ASSOCIATED WITH A MEMORY ACCESS OPERATION 505

CAUSING A FIRST VOLTAGE REGULATOR OF A FIRST SET OF VOLTAGE REGULATORS TO APPLY A FIRST VOLTAGE TO AN UNSELECTED WORDLINE 510

CAUSING A SECOND VOLTAGE TO BE APPLIED TO A SWITCH TO ISOLATE THE UNSELECTED WORDLINES FROM THE FIRST VOLTAGE REGULATOR 515

CAUSING A SECOND VOLTAGE REGULATOR OF A SECOND SET OF VOLTAGE REGULATORS TO APPLY A THIRD VOLTAGE TO A GATE OF A TRANSISTOR TO COUPLE THE FIRST VOLTAGE REGULATOR TO ONE OR MORE DUMMY WORDLINES 520

CAUSING THE FIRST VOLTAGE REGULATOR TO APPLY A FOURTH VOLTAGE TO THE ONE OR MORE DUMMY WORDLINES 525

FIG. 5

VOLTAGE REGULATOR SUPPLY FOR INDEPENDENT WORDLINE READS

REFERENCE TO RELATED APPLICATIONS

This application claims the priority benefit of U.S. Provisional Application No. 63/418,365, filed Oct. 21, 2022, which is incorporated by reference herein.

TECHNICAL FIELD

Embodiments of the disclosure relate generally to memory sub-systems, and more specifically, relate to an improved voltage regulator supply for independent wordline (IWL) reads.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 5 is a flow diagram of an example method utilized in improved system including global voltage regulators and local voltage regulators for IWL reads, in accordance with some embodiments of the present disclosure.

DETAILED DESCRIPTION

Figure 1A:
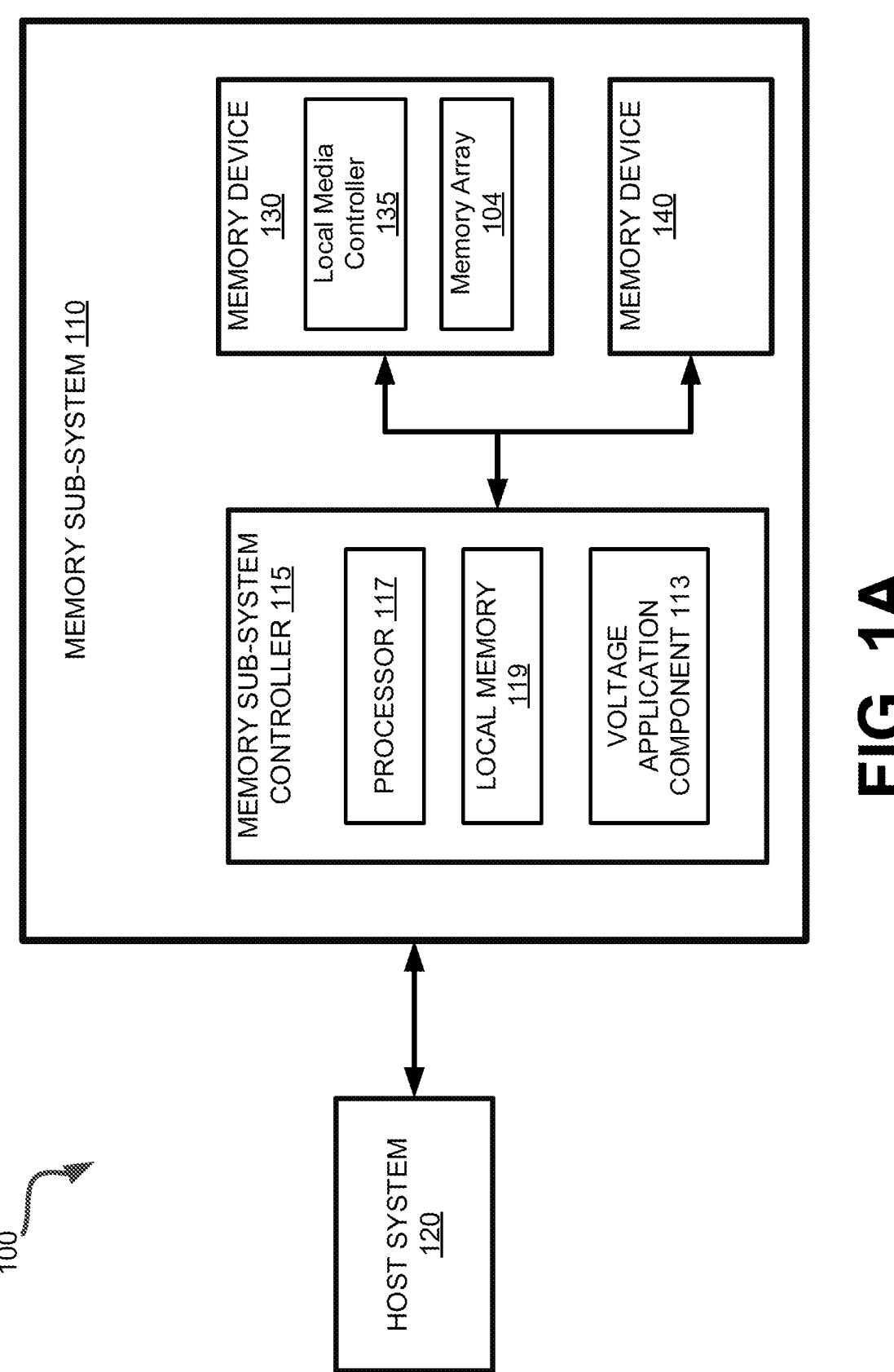
FIG. 1A illustrates an example computing system that includes a memory sub-system in accordance with some embodiments of the present disclosure.

Aspects of the present disclosure are directed to an improved voltage regulator supply for independent wordline (IWL) reads. In particular, aspects of the present disclosure are directed to decreasing the number of voltage supplies utilized during read operations by each individual plane in a memory device. A memory sub-system can be a storage device, a memory module, or a combination of a storage device and memory module. Examples of storage devices and memory modules are described below in conjunction with FIG. 1A. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. For example, NAND memory, such as 3D flash NAND memory, offers storage in the form of compact, high density configurations. A non-volatile memory device is a package of one or more dice, each including one or more planes. For some types of non-volatile memory devices (e.g., NAND memory), each plane includes a set of physical blocks. Each block includes a set of pages. Each page includes a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can include multiple memory cells arranged in a two-dimensional or a three-dimensional grid. The memory cells can be formed on a silicon wafer in an array of columns (also hereinafter referred to as bit lines) and rows (also hereinafter referred to as wordlines). A wordline can refer to one or more conductive lines coupled to memory cells of a memory device that are used with one or more bit lines to generate the address of each of the memory cells. The intersection of a bit line and wordline constitutes the address of the memory cell. A block hereinafter refers to a unit of the memory device used to store data and can include a group of memory cells, a wordline group, a wordline, or individual memory cells. One or more blocks can be grouped together to form separate partitions (e.g., planes) of the memory device in order to allow concurrent operations to take place on each plane. Each data block can include a number of sub-blocks, where each sub-block is defined by an associated pillar (e.g., a vertical conductive trace) extending from a shared bit line. Memory pages (also referred to herein as "pages") store one or more bits of binary data corresponding to data received from the host system. To achieve high density, a string of memory cells in a non-volatile memory device can be constructed to include a number of memory cells at least partially surrounding a pillar of channel material. The memory cells can be coupled to access lines, which are commonly referred to as "wordlines," often fabricated in common with the memory cells, so as to form an array of strings in a block of memory. The compact nature of certain non-volatile memory devices, such as 3D flash NAND memory, means wordlines are common to many memory cells within a block of memory.

As described above, memory access operations can be performed concurrently on multiple planes. For example, an independent wordline (IWL) read is a read operation performed on multiple planes at the same time, thus increasing the read throughput. A plane can refer to one or more blocks of memory cells physically grouped together. To perform the read operations at each plane, the memory device controller can cause multiple voltages to be applied to memory cells of each plane. For example, the memory device can cause different voltages to be applied to a selected wordline (e.g., a wordline coupled to a set of memory cells selected for a read operation), an unselected wordline (e.g., a wordline coupled to a set of memory cell not selected for a read operation), a dummy wordline (e.g., wordline coupled to memory cells that are not used for storing any data), a top of the memory array or bottom or the memory array dummy wordline (e.g., a wordline coupled to memory cells not storing data located at a top or bottom of a memory pillar), a select gate source (SGS) (e.g., field-effect transistor that can be source select transistors), and/or a select gate drain (SGD) (e.g., field effect transistor that can be can be drain select transistors).

Some solutions can utilize a dedicated regulator or voltage source to generate the voltage applied to each respective conductive line. For example, the memory device can include dedicated voltage regulators for each plane. Additionally, as memory device performance improves, a higher rate of IWL reads is being utilized along with adjusting a pillar shape—e.g., increasing a number of memory cells in the memory device. However, each regulator consumes additional power and takes up additional area in the memory device, since each additional regulator would increase the power consumption and reduce the area for placing memory cells. As the memory device increases the rate of IWL reads, the more area is reduced and power is consumed—e.g., a memory device with a relatively high number of planes would utilize a relatively high number of independent regulators. Accordingly, some solutions may struggle to scale as more planes are utilized in a memory device.

Aspects of the present disclosure address the above and other deficiencies by implementing an improved architecture (e.g., voltage regulator) for IWL reads. This can reduce the number of local regulators in the memory sub-system. For example, the system implemented for supplying voltages during IWL reads can include global (e.g., shared) regulators or voltage sources and reduce a number of local regulators for each plane. In one embodiment, the memory device can include a first set of voltage regulators dedicated to each plane (e.g., local voltage regulators) and a second set of voltage regulators that are shared amongst the planes of the memory device—e.g., the second set of voltage regulators (e.g., global voltage regulators) can be utilized by all planes to supply a voltage. In such embodiments, one of the local voltage regulators supplying voltages to a plane can be coupled to a cascode switch—e.g., a switch that is a two-stage amplifier configured to selectively couple one of the local voltage regulators to a wordline, dummy wordline, or select gate, etc. The cascode switch can include a transistor coupled to a voltage supply line, conductive line (e.g., wordline, dummy wordline, or a select gate line coupled with the SGS or SGD), or component (e.g., memory cell), where a gate of the transistor is coupled to a global voltage regulator, a drain of the transistor is coupled to one of the local voltage regulators of the plane as described with reference to FIGS. 2 and 3, and a source of the transistor is coupled to the voltage supply line, conductive line, or component. Accordingly, the memory sub-system can cause multiple voltages to be applied to the selected conductive line using the local voltage regulators dedicated to each plane and the global voltage regulators shared by the planes. In one embodiment, the number of voltage regulators utilized can depend on a type of memory cell. For example, different numbers of local and global voltage regulators can be used for memory cells storing multiple-bits compared with memory cells storing a single bit—e.g., multi-bit memory cells can be programmed to additional threshold voltages and the system can include additional local and global voltage regulators to supply the additional threshold voltages.

As the memory sub-system is using the cascode switch, the memory sub-system controller can select which voltage supply line to activate and deactivate during a memory access operation (e.g., during a read operation). For example, a first local voltage regulator of the plane can be coupled to a voltage supply line for selected wordlines (e.g., wordlines coupled to a memory cell selected for a read operation) and a second local voltage regulator can be coupled to voltage supply lines for unselected wordlines (e.g., wordlines coupled to a memory cell not selected for a read operation), adjacent wordlines (e.g., wordlines adjacent to the selected wordline), dummy wordlines at a top and bottom of an array (e.g., wordlines at a top or bottom of a memory pillar not storing data), a select gate source (SGS) and a select gate drain (SGD). In such embodiments, voltage supply lines for the dummy wordlines (e.g., adjacent wordlines), dummy wordlines at the top and bottom, SGS, and SGD can be coupled to the cascode switch e.g., each supply line can include a transistor, where the gate of each transistor is coupled to a different global voltage regulator. The memory sub-system controller can cause the first local voltage regulator of the plane to apply a first voltage (e.g., a read voltage) to the selected wordline. In one embodiment, the memory sub-system controller can cause the second local voltage regulator of the plane to apply a second voltage (e.g., a pass voltage that ensures each memory cell coupled to the unselected wordline is "on") to the unselected wordlines while the remaining supply lines are decoupled from the second local voltage regulator. After the unselected wordlines are driven to the second voltage, the memory sub-system controller can deactivate a first switch coupling the second local voltage regulator to the unselected wordlines, thus floating the unselected wordlines. The memory sub-system controller can cause the first global voltage regulator to apply a voltage (e.g., a voltage greater than a threshold voltage of a gate) at a gate of a second switch to activate the second switch and couple the top and bottom dummy wordlines to the second local voltage regulator. In some cases, the memory sub-system controller can cause the second local voltage regulator of the plane to apply a third voltage (e.g., a second pass voltage that ensures each memory cell coupled to the top and bottom dummy wordlines is "on") to the top and bottom dummy wordlines, while the unselected wordlines are floating. Additional details regarding the timing is described with reference to FIG. 3. Accordingly, the memory sub-system can cause different voltages to be applied to respective conductive lines using the architecture for IWL reads as described herein.

By utilizing the local and global voltage regulators for IWL reads as described herein, the overall power consumption can be reduced and area can be improved. For example, utilizing the local and global voltage regulators can reduce a number of regulator's by at least one-half in some embodiments. Accordingly, the memory device can scale and increase a number of IWL reads and improve read performances by implementing the architecture described herein.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc.

The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device 130 having control logic (e.g., local controller 135) on the die and a controller (e.g., memory sub-system controller 115) for media management within the same memory device package. An example of a managed memory device is a managed NAND (MNAND) device. Memory device 130, for example, can represent a single die having some control logic (e.g., local media controller 135) embodied thereon. In some embodiments, one or more components of memory sub-system 110 can be omitted.

In one embodiment, memory device 130 includes a voltage application component 113 that can manage the voltages applied to components of on a non-volatile memory device, such as memory device 130, of memory sub-system 110. For example, voltage application component 113 can manage the voltages to be applied to memory device 130 during a memory access operation (e.g., read, write, or erase operation). In one embodiment, the memory device 130 includes global voltage regulators and local voltage regulators for IWL reads as described herein. In such embodiments, the memory device 130 can include global voltage regulators that are shared by all planes of the memory device 130 as described with reference to FIG. 2. In one embodiment, the memory device 130 can also include local voltage regulators for each plane of the memory device 130 as described with reference to FIG. 2—e.g., voltage regulators exclusive to each plane. In some embodiments, the voltage application component 113 can cause the global voltage regulators to activate the switches coupling certain local voltage regulator to respective conductive lines (e.g., conductive lines such as an unselected wordline, dummy wordline, or a conductive line coupled to an select gate source (SGS) or select gate drain (SGD)) of the memory device 130. For example, memory device 130 can receive a request associated with a memory access operation. In such embodiments, the voltage application component 113 can cause the local voltage regulator to apply a first voltage associated with a read operation (e.g., a Vpass voltage) to unselected wordlines (e.g., wordlines coupled to a memory cell not selected for the memory access operation) in response to receiving the memory access operation. The voltage application component 113 can then apply a voltage to a first switch coupling the local voltage regulator to the unselected wordlines to isolate the unselected wordlines—e.g., a voltage less than the threshold voltage of a gate of the switch that causes the switch to deactivate. The voltage application component 113 can then cause a global voltage regulator to activate a second switch coupling the local voltage regulator to dummy wordlines (e.g., wordlines storing data not associated with the host system 120) by applying a voltage to a gate of the second switch—e.g., the voltage greater than the threshold voltage of the second switch. Accordingly, the voltage application component 113 can cause a second voltage of the read operation (e.g., Vpass2) to be applied to the dummy wordlines while the unselected wordlines are isolated and in a floating state (e.g., isolated from any voltage regulator or power supply). The voltage application component 113 can continue to activate and deactivate switches to apply a voltage to one or more conductive lines of the memory device to execute the read operation as described with reference to FIGS. 3 and 4.

In some embodiments, the memory sub-system controller 115 includes at least a portion of voltage application component 113. For example, the memory sub-system controller 115 can include a processor 117 (e.g., a processing device) configured to execute instructions stored in local memory 119 for performing the operations described herein. In some embodiments, voltage application component 113 is part of the host system 110, an application, or an operating system. In other embodiment, local media controller 135 includes at least a portion of voltage application component 113 and is configured to perform the functionality described herein. In such an embodiment, voltage application component 113 can be implemented using hardware or as firmware, stored on memory device 130, executed by the control logic (e.g., voltage application component 113) to perform the operations related to program recovery described herein.

Figure 1B:
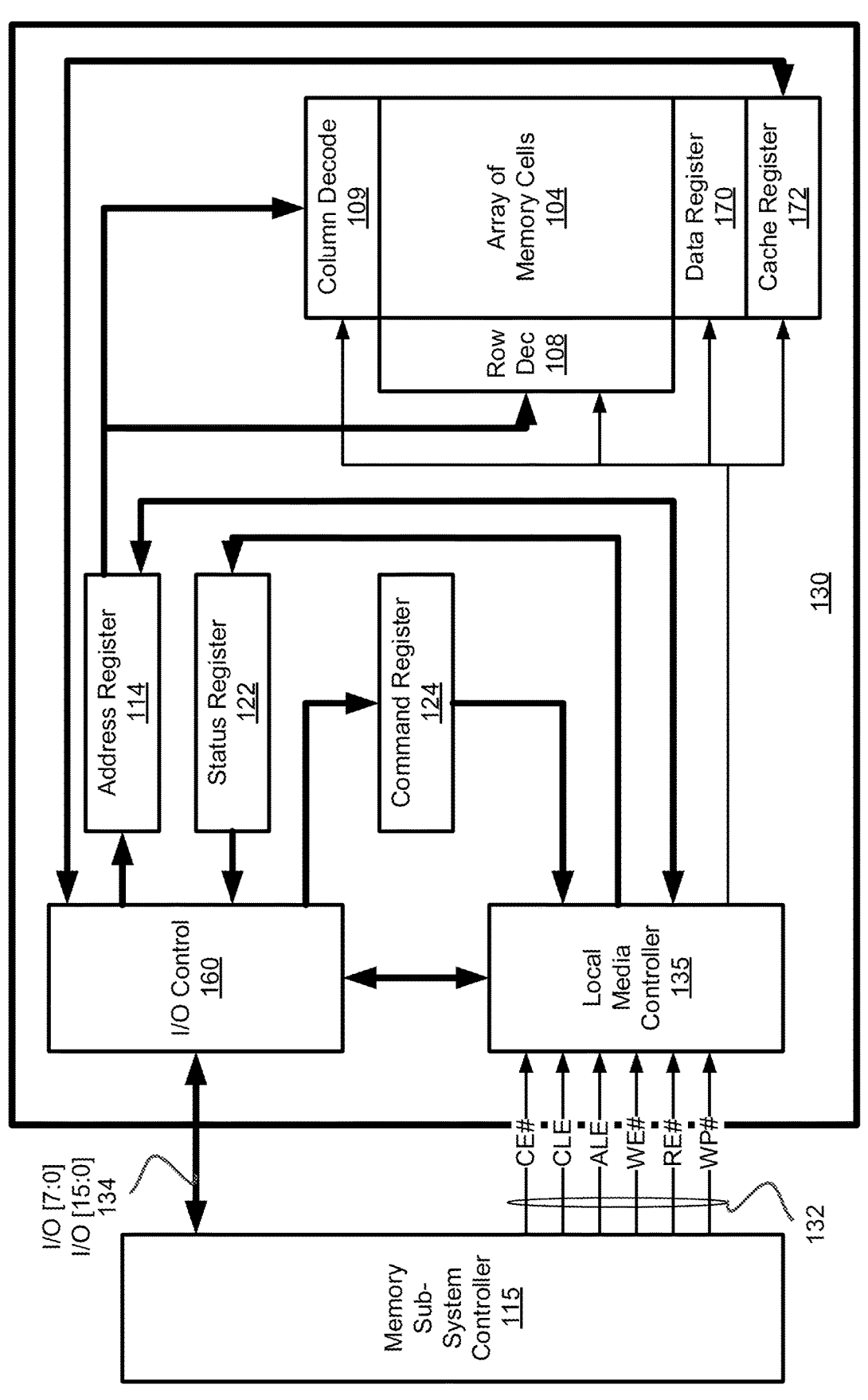
FIG. 1B is a block diagram of a memory device in communication with a memory sub-system controller of a memory sub-system, in accordance with some embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device. The memory sub-system controller 115 can include the voltage application component 113.

Memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bit line). A single access line may be associated with more than one logical row of memory cells and a single data line may be associated with more than one logical column. Memory cells (not shown in FIG. 1B) of at least a portion of array of memory cells 104 are capable of being programmed to one of at least two target data states. In one embodiment, the array of memory cells 104 (i.e., a "memory array") can include a number of sacrificial memory cells used to detect the occurrence of read disturb in memory device 130, as described in detail herein.

Row decode circuitry 108 and column decode circuitry 109 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device 130. An address register 114 is in communication with I/O control circuitry 160 and row decode circuitry 108 and column decode circuitry 109 to latch the address signals prior to decoding. A command register 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 109 to control the row decode circuitry 108 and column decode circuitry 109 in response to the addresses.

The local media controller 135 is also in communication with a cache register 172. Cache register 172 latches data, either incoming or outgoing, as directed by the local media controller 135 to temporarily store data while the array of memory cells 104 is busy writing or reading, respectively, other data. During a program operation (e.g., write operation), data may be passed from the cache register 172 to the data register 170 for transfer to the array of memory cells 104; then new data may be latched in the cache register 172 from the I/O control circuitry 160. During a read operation, data may be passed from the cache register 172 to the I/O control circuitry 160 for output to the memory sub-system controller 115; then new data may be passed from the data register 170 to the cache register 172. The cache register 172 and/or the data register 170 may form (e.g., may form a portion of) a page buffer of the memory device 130. A page buffer may further include sensing devices (not shown in FIG. 1B) to sense a data state of a memory cell of the array of memory cells 104, e.g., by sensing a state of a data line connected to that memory cell. A status register 122 may be in communication with I/O control circuitry 160 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 236 and outputs data to the memory sub-system controller 115 over I/O bus 236.

For example, the commands may be received over input/output (I/O) pins [7:0] of I/O bus 236 at I/O control circuitry 160 and may then be written into command register 124. The addresses may be received over input/output (I/O) pins [7:0] of I/O bus 236 at I/O control circuitry 160 and may then be written into address register 114. The data may be received over input/output (I/O) pins [7:0] for an 8-bit device or input/output (I/O) pins [15:0] for a 16-bit device at I/O control circuitry 160 and then may be written into cache register 172. The data may be subsequently written into data register 170 for programming the array of memory cells 104.

In an embodiment, cache register 172 may be omitted, and the data may be written directly into data register 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) may be used in the various embodiments.

Figure 2:
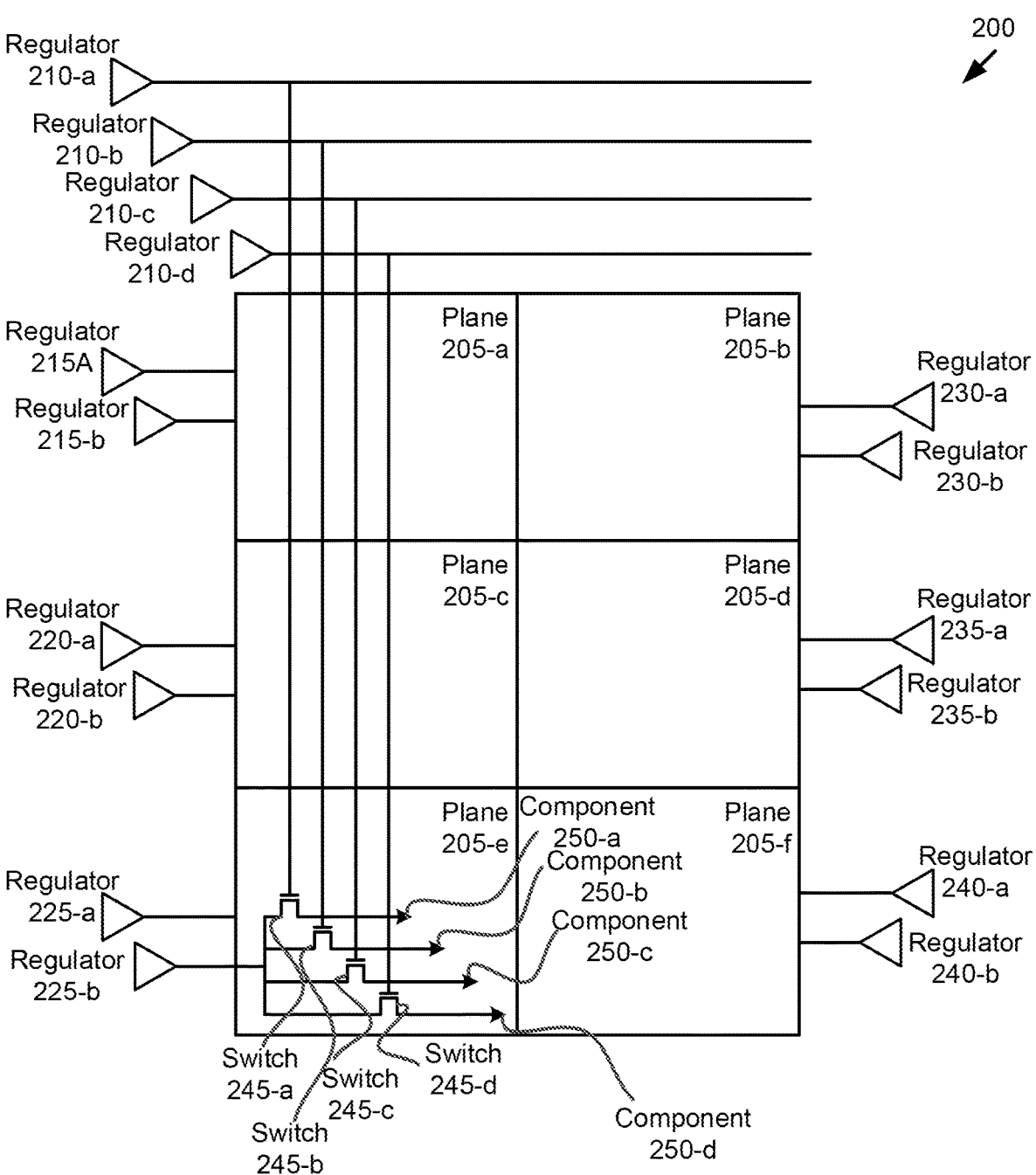
FIG. 2 is a system diagram of global voltage regulators and local voltage regulators for independent wordline (IWL) reads, in accordance with some embodiments of the present disclosure.

FIG. 2 illustrates an example system 200 utilizing global voltage regulators and local voltage regulators for IWL reads, in accordance with some embodiments of the present disclosure. In an embodiment, the system 200 can be an example of a memory device 130 as described with reference to FIG. 1A. In one embodiment, the system 200 can include planes 205. In one embodiment, the plane 205 can include one or more blocks of memory cells grouped together as a separate partition, where the block refers to a unit of the memory device used to store data and can include a group of memory cells, a wordline group, a wordline, or individual memory cells. Although six (6) planes (e.g., planes 205-*a* through 205-*f*) are illustrated, the system 200 can include more than or less than six (6) planes. For example, the system 200 can include four (4) planes, eight (8) planes, ten (10) planes, twelve (12) planes, or any other number of planes. In one embodiment, the system 200 can include regulator 210-*a* (e.g., voltage regulator or voltage supply), regulator 210-*b*, regulator 210-*c*, and regulator 210-*d*. In some embodiments, the regulators 210 can be referred to as global regulators or a first set of voltage regulators that are shared amongst the planes 205-*a* through 205-*e*. In one embodiment, the regulators 210 are coupled to each plane 205 of the system 200—e.g., the regulators 210 are shown coupled to plane 205-*e* for ease of illustration only, the regulators 210 are also coupled to the remaining planes 205 (e.g., planes 205-*a*, 205-*b*, 205-*c*, 205-*d*, 205-*f*). In one embodiment, each plane 205 is also coupled to local regulators that are dedicated exclusively to a plane 205— e.g., regulators 215-*a* and 215-*b* are coupled to plane 205-*a*, regulators 220-*a* and 220-*b* are coupled to plane 205-*c*, regulators 225-*a* and 225-*b* are coupled to plane 205-*e*, regulators 230-*a* and 230-*b* are coupled to plane 205-*b*, regulators 235-*a* and 235-*b* are coupled to plane 205-*d*, and regulators 240-*a* and 240-*b* are coupled to plane 205-*f* In one embodiment, the local regulators that are dedicated to a plane 205 can be considered a second set of regulators. Although each plane 205 is illustrated to be coupled to two local voltage regulators, each plane can be coupled with more than or less than two (2) local regulators. Similarly, although there are four (4) global regulators 210 illustrated, the system can include more than or less than four (4) global regulators 210. For example, for a system 200 including multi-bit memory, there can be three (3) global regulators 210 and three (3) local regulators for each plane 205 of the system 200. In one embodiment, a number of local regulators can be based on a number of conductive lines to apply a voltage to during a read operation. In one embodiment, unselected wordlines (e.g., wordlines not selected for a read operation), dummy wordlines, top or bottom dummy wordlines, or conductive lines coupled to a select gate source (SGS) or select gate drain (SGD) are collectively referred to herein as "components 250".

In one embodiment, a first local regulator (e.g., regulator 215A, 220-*a*, 225-*a*, 230-*a*, 235-*a*, and 240-*a*) can be coupled to a selected wordline for a read operation at each plane 205. In some embodiments, voltage application component 113 can cause each first local regulator to apply a respective voltage to the selected wordline during a memory access operation (e.g., read operation) with respect to the respective plane 205. For example, regulators 215-*a*, 220-*a*, 225-*a*, 230-*a*, 235-*a*, and 240-*a* can each apply a respective voltage to the respective plane 205 for performing a memory access operation. In one embodiment, a second local regulator (e.g., regulator 215-*b*, 220-*b*, 225-*b*, 230-*b*, 235-*b*, and 240-*b*) can be coupled to a cascode switch that can selectively couple the second local regulator to, wordlines, SGS, or SGD at each plane 205 during the memory access operation, where the cascode switch is a two-stage amplifier. For example, for plane 205-*e*, regulator 225-*b* can be coupled to switch 245-*a*, switch 245-*b*, switch 245-*c*, and switch 245-*d*—e.g., collectively referred to as a cascode switch. In one embodiment, switch 245-*a*, switch 245-*b*, switch 245-*c*, and switch 245-*d* can be an example of a transistor—e.g., an n-type metal-oxide-semiconductor (NMOS) transistor. In some embodiments, each global regulator 210 can be coupled to a gate of a respective switch 245-*a*, switch 245-*b*, switch 245-*c*, and switch 245-*d*. For example, at plane 205-*e* regulator 210-*a* can be coupled with switch 245-*a*, regulator 210-*b* can be coupled with switch 245-*b*, regulator 210-*c* can be coupled with switch 245-*c*, and regulator 210-*d* can be coupled with 245-*d*. In one embodiment, a difference between a respective voltage at or applied to a component 250 and a voltage applied to a respective gate of switch 245-*a*, switch 245-*b*, switch 245-*c*, and switch 245-*d* can be greater than the threshold voltage of the respective switch 245-*a*, switch 245-*b*, switch 245-*c*, and switch 245-*d*. For example, a difference between a voltage applied by regulator 210-*a* and a voltage applied to component 250-*a* can be greater than a threshold voltage of switch 245-*a*. Accordingly, because each switch 245 can be an NMOS transistor, when the difference between the voltage applied by regulator 210-*a* and a voltage applied to component 250-*a* and is greater than the threshold voltage of switch 245-*a*, the switch 245-*a* can be activated. In that, a voltage from a respective regulator 210 to a respective gate of a switch 245 can cause the switch 245 to activate and couple the regulator 225 to the respective component 250. For example, the voltage application component 113 can cause regulator 210-*a* to apply a voltage greater than the threshold voltage of switch 245-*a* to a gate of switch 245-*a* to activate switch 245-*a* and couple regulator 225-*a* to component 250. In one embodiment, the system 200 can perform an IWL read operation by causing various regulators 210 to apply voltages to switches 245 and couple the regulator 225 to any of the components 250—e.g., to component 250-*a*, component 250-*b*, component 250-*c*, or component 250-*d*—during the read operation. In one embodiment, component 250-*a* is an example of a dummy wordline in a middle of a memory array or memory pillar, component 250-*b* is an example of a dummy wordline at a top or bottom or a memory array or memory pillar, component 250-*c* is an example of a conductive line coupled a select gate drain (SGD), and component 250-*d* is an example of a conductive line coupled to a select gate source (SGS). Additional details regarding the memory access operation, regulators, and components is described with reference to FIG. 3.

By utilizing the architecture described herein, the system 200 includes less voltage regulators, reduces power consumption, and increases area available in the system 200 to store data.

Figure 3:
FIG. 3 is a system diagram of global voltage regulators and local voltage regulators for IWL reads, in accordance with embodiments of the present disclosure.

FIG. 3 illustrates an example system 300 utilizing global voltage regulators and local voltage regulators for IWL reads, in accordance with some embodiments of the present disclosure. In an embodiment, the system 300 can be an example of plane 305-*e* as described with reference to FIG. 2. For example, the system 300 can include regulator 225-*a* and regulator 225-*b*—e.g., collectively referred to as local regulators that are dedicated to plane 305-*e*. The system 300 can also include regulator 210-*a* coupled to a gate of switch 245-*a*, regulator 210-*b* coupled to a gate of switch 245-*b*, a regulator 210-*c* coupled to a gate of switch 245-*c*, and a regulator 210-*d* coupled to a gate of switch 245, where regulators 210 can be collectively referred to as global regulators that are shared by planes 205 as described with reference to FIG. 2. In one embodiment, the system 300 also includes switch 305, switch 310, switch 315, switch 320, switch 325, and switch 330. In some embodiments, the regulator 225-*b* is coupled with one or more components (e.g., components 250 as described with reference to FIG. 2). For example, the regulator 225 can be coupled with unselected wordline(s) (e.g., wordlines coupled to memory cells not selected for a read operation) 355, dummy wordline (s) 360 (e.g., dummy wordlines in a middle of an array or adjacent to the unselected wordlines that are coupled to memory cells not storing data), dummy wordline(s) 365

(e.g., dummy wordlines at a top or bottom of an array or pillar that are coupled to memory cells not storing data), select gate source (SGS 370), and select gate drain (SGD) 375.

In one embodiment, a controller (e.g., memory subsystem controller 115 as described with reference to FIG. 1) can cause regulators 225-a and 225-b to apply respective voltages for performing a memory access operation. In one embodiment, the system 300 can perform a read operation and apply the voltages as described herein and with reference to FIG. 4.

In one embodiment, switch 305 is configured to couple the regulator 225-a to selected wordline(s) 350 during the read operation. In some embodiments, voltage application component 113 can cause the switch 305 to be activated (e.g., on) or deactivated (e.g., off). In one embodiment, the voltage application component 113 can cause switch 305 to be on and the regulator 225-a to apply a read voltage to the selected wordline(s) 350 during the read operation.

In one embodiment, switch 310 is configured to couple the regulator 225-b to unselected wordline(s) 355 during the read operation. In some embodiments, voltage application component 113 can cause the switch 310 to be activated (e.g., on) or deactivated (e.g., off). In one embodiment, the voltage application component 113 can cause switch 310 to be on and the regulator 225-a to apply a read bias (e.g., Vpass) to the unselected wordline(s) 355. In one embodiment, the voltage application component 113 can isolate the unselected wordlines 355 from the regulator 225-b after the unselected wordlines are at the read bias as described with reference to FIG. 4.

In one embodiment, switch 245-a and switch 315 are configured to couple the regulator 225-b to dummy wordline(s) 360. In one embodiment, the voltage application component 113 can cause regulator 210-a to apply a voltage to a gate of switch 245-a. In one embodiment, the switch 245-a is off when a difference between the voltage at the gate of the switch 245-a and the voltage at dummy wordline(s) 360 (e.g., or on a voltage supply line between switch 245-a and switch 315) is less than a voltage threshold of switch 245-a. In one embodiment, the switch 245-a is on when a difference between the voltage at the gate of the switch 245-a and the voltage at dummy wordline(s) 360 (e.g., or on a voltage supply line between switch 245-a and switch 315) is equal to or greater than a voltage threshold of switch 245-a. For example, the voltage application component 113 can cause the regulator 225-b to apply a second read bias voltage (e.g., Vpass1) to the dummy wordline(s) 360 during the read operation when switch 245-a and switch 315 are activated. Accordingly, the voltage application component 113 can cause a Vpass1+Vth of Switch 245-a to be applied to the switch 245-a to activate switch 245-a, where Vpass1 is the read bias voltage and Vth of switch 245-a is a threshold voltage of the switch 245-a. As described above and with reference to FIG. 2, In one embodiment regulator 210-a is shared between one or more planes (e.g., planes 305). Additionally, each plane can be executing a read operation concurrently or asynchronously with respect to the remaining planes. Because the read operations at the different planes can be at different stages, the system 300 can include local switches (e.g., switch 305, switch 310, switch 315, switch 320, switch 325, switch 330) to couple the regulator 225-a or 225-b to the one or more components during the read operation. For example, a plane 205-c can utilize the regulator 210-b possibly causing the switch 245-a to activate at plane 205-e. Accordingly, to ensure the regulator 225-b is coupled when desired during the read operation, the voltage application component 113 cause the switch 315 to be activated (e.g., on) or deactivated (e.g., off).

In one embodiment, switch 245-b and switch 320 are configured to couple the regulator 225-b to dummy wordline(s) 365. In some embodiments, voltage application component 113 can cause the switch 315 to be activated (e.g., on) or deactivated (e.g., off). In one embodiment, the voltage application component 113 can cause regulator 210-b to apply a voltage to a gate of switch 245-b. In one embodiment, the switch 245-b is off when a difference between the voltage at the gate of the switch 245-b and a voltage at dummy wordline(s) 365 (e.g., or on a voltage supply line between switch 245-b and switch 320) is less than a voltage threshold of switch 245-b. In one embodiment, the switch 245-b is on when a difference between the voltage at the gate of the switch 245-b and a voltage at dummy wordline(s) 365 (e.g., or on a voltage supply line between switch 245-b and switch 320) is equal to or greater than a voltage threshold of switch 245-b. For example, the voltage application component 113 can cause the regulator 225-b to apply a third read bias voltage (e.g., Vpass2) to the dummy wordline(s) 365 during the read operation when switch 245-a and switch 315 are activated. Accordingly, the voltage application component 113 can cause a Vpass2+Vth of Switch 245-b to be applied to the switch 245-b to activate switch 245-b, where Vpass2 is the second read bias voltage and Vth of switch 245-b is a threshold voltage of the switch 245-b. In one embodiment, the second read bias is greater than the first read bias—e.g., Vpass2 is greater than Vpass1.

In one embodiment, switch 245-c and switch 325 are configured to couple the regulator 225-b to SGS 370. In some embodiments, voltage application component 113 can cause the switch 325 to be activated (e.g., on) or deactivated (e.g., off). In one embodiment, the voltage application component 113 can cause regulator 210-c to apply a voltage to a gate of switch 245-c. In one embodiment, the switch 245-c is off when a difference between the voltage at the gate of the switch 245-c and a voltage at SGS 370 (e.g., or on a voltage supply line between switch 245-c and switch 325) is less than a voltage threshold of switch 245-c. In one embodiment, the switch 245-c is on when a difference between the voltage at the gate of the switch 245-c and a voltage at SGS 370 (e.g., or on a voltage supply line between switch 245-c and switch 325) is equal to or greater than a voltage threshold of switch 245-c. For example, the voltage application component 113 can cause the regulator 225-b to apply a first voltage (e.g., VSGSRV) to the SGS 370 during the read operation when switch 245-c and switch 325 are activated. Accordingly, the voltage application component 113 can cause a VSGSRV+Vth of Switch 245-c to be applied to the switch 245-c to activate switch 245-c, where VSGSRV is the first voltage and Vth of switch 245-c is a threshold voltage of the switch 245-c.

In one embodiment, switch 245-d and switch 330 are configured to couple the regulator 225-b to SGD 375. In some embodiments, voltage application component 113 can cause the switch 330 to be activated (e.g., on) or deactivated (e.g., off). In one embodiment, the voltage application component 113 can cause regulator 210-d to apply a voltage to a gate of switch 245-d. In one embodiment, the switch 245-d is off when a difference between the voltage at the gate of the switch 245-d and a voltage at SGD 375 (e.g., or on a voltage supply line between switch 245-d and switch 330) is less than a voltage threshold of switch 245-d. In one embodiment, the switch 245-d is on when a difference between the voltage at the gate of the switch 245-d and a voltage at SGD 375 (e.g., or on a voltage supply line between switch 245-*d* and switch 330) is equal to or greater than a voltage threshold of switch 245-*d*. For example, the voltage application component 113 can cause the regulator 225-*b* to apply a second voltage (e.g., VSGDRV) to the SGD 375 during the read operation when switch 245-*d* and switch 330 are activated. Accordingly, the voltage application component 113 can cause a VSGDRV+Vth of Switch 245-*d* to be applied to the switch 245-*d* to activate switch 245-*d*, where VSGDRV is the second voltage and Vth of switch 245-*d* is a threshold voltage of the switch 245-*d*.

Figure 4:
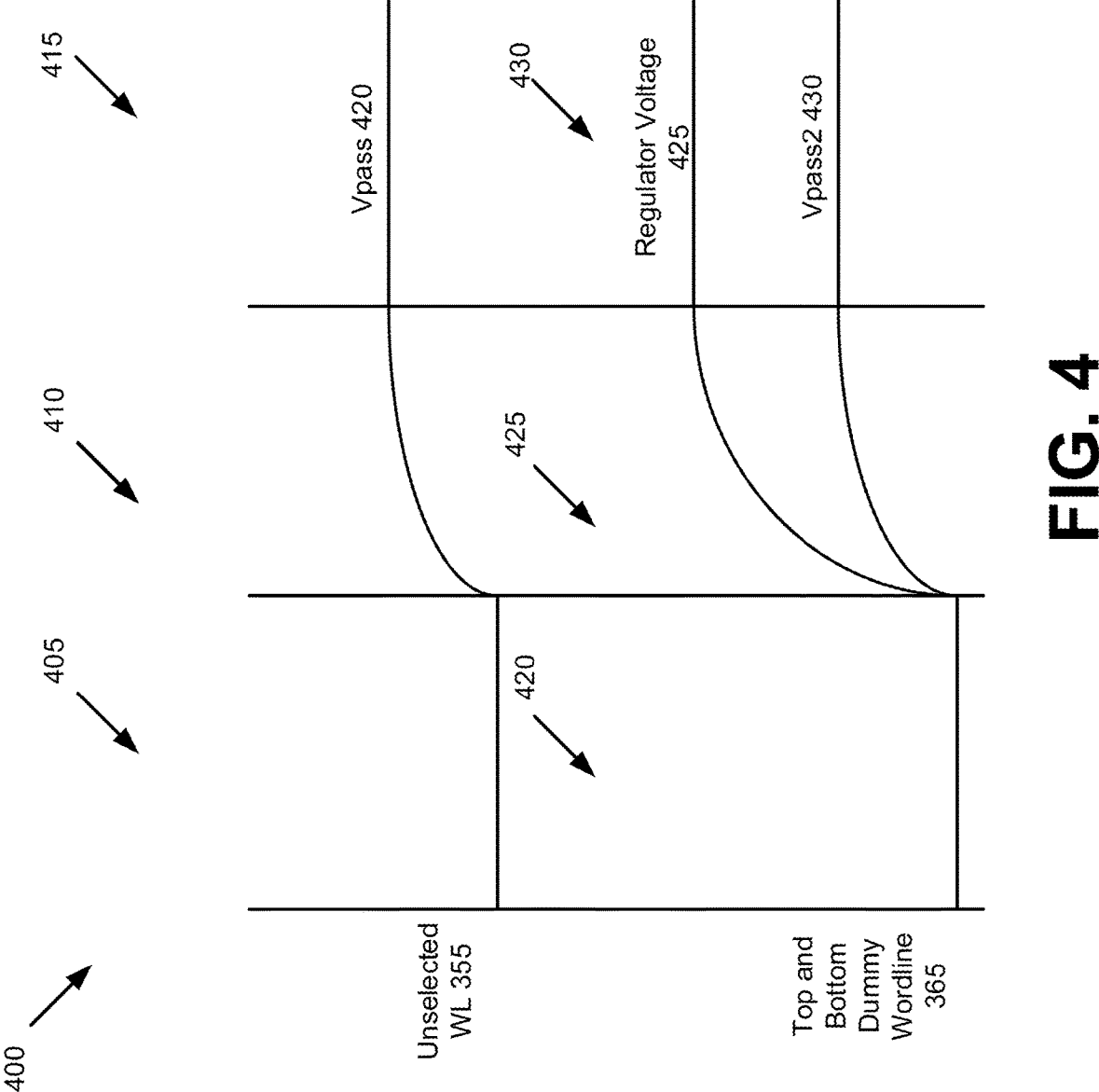
FIG. 4 is a timing diagram for global voltage regulators and local voltage regulators for IWL reads, in accordance with embodiments of the present disclosure.

FIG. 4 is a timing diagram 400 implemented in a system that includes global voltage regulators and local voltage regulators for IWL reads, in accordance with some embodiments of the present disclosure. In one embodiment, the operations referenced by timing diagram 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the operations of timing diagram 400 are performed by local media controller 135 or voltage application component 113 of FIG. 1A and FIG. 1B. During a read operation performed on a non-volatile memory device, such as memory device 130 or system 300, certain voltages can be applied to wordlines and the channel. FIG. 4 illustrates the voltage applied to an unselected wordline (e.g., the unselected wordline 355) and the voltage applied to top and bottom dummy wordlines 365 (e.g., wordlines located at a top and bottom of a memory array or pillar that are coupled with memory cells not storing data) during the read operation. In this embodiment, the read operation includes six (6) time intervals (e.g. time interval 405, time interval 410, time interval 415, time interval 420, time interval 425, and time interval 430). In some embodiments, time intervals 420, 425, and 430 after time intervals 405, 410, and 415. It should be noted, each time interval is an example and is not limiting on the claims. That is, each time interval can be longer or faster than illustrated in FIG. 3 in some embodiments. Other time intervals are possible.

During time interval 405, system 300 can initiate a memory access operation (e.g., a read operation) in response to receiving a request associated with a memory access operation. In one embodiment, during time interval 405, voltage application component 113 can activate switch 310 and couple regulator 225-*b* to unselected wordline(s) 355. In one embodiment, voltage application component 113 can also activate switch 305 to couple regulator 225-*a* to selected wordline(s) 350—e.g., the voltage application component 113 can activate switch before, after, or during time interval 405.

During time interval 410, voltage application component 113 can cause regulator 225-*b* to apply a first voltage (e.g., Vpass 420 that is configured to activate each memory cell coupled to the unselected wordline) to unselected wordlines(s) 355. Accordingly, a voltage across the unselected WL 355 can increase during time interval 410. In one embodiment, the voltage application component 113 can also cause regulator 225-*a* to apply a second voltage (e.g., a read voltage) to selected wordline(s) 350.

During time interval 415, the voltage application component 113 can determine the voltage at the unselected wordline(s) 355 is at the first voltage (e.g., at Vpass 420)—e.g., the voltage application component 113 can apply the first voltage for a predetermined duration configured to drive the unselected wordline(s) 355 to the first voltage. In one embodiment, the voltage application component 113 can deactivate switch 310 after the unselected wordline(s) 355 are driven to the first voltage. In such embodiments, the unselected wordline(s) 355 can be isolated from the regulator 225-*b* and left in a floating state—e.g., decoupled from voltage sources or other components that can affect the voltage at the unselected wordline(s) 355. In one embodiment, the voltage application component 113 can also determine a voltage at the selected wordline(s) 350 is at the second voltage. In such embodiments, the voltage application component 113 can deactivate switch 305 to decouple the selected wordline(s) 350 from regulator 225-*a* or refrain from causing regulator 225-*a* from applying the second voltage.

During time interval 420, after the switch 310 is deactivated and regulator 225-*b* is decoupled from unselected wordline(s) 355, voltage application component 113 can cause switch 320 to be activated—e.g., the voltage application component 113 can cause a voltage to be applied to a gate of switch 320. In such embodiments, activating switch 320 can couple switch 245-*b* to the dummy wordline 365.

During time interval 425, the voltage application component 113 cause regulator 210-*b* to supply a third voltage to a gate of switch 245-*b*—e.g., cause a regulator voltage 425 or Vpass2+Vthswitch 245-*b* to be applied as described with reference to FIG. 3. In one embodiment, the switch 245-*b* is activated (e.g., on) when the third voltage is applied to the gate. In such embodiments, the regulator 225-*b* can be coupled with the dummy wordline(s) 360. In one embodiment, the voltage application component 113 can cause the regulator 225-*b* to generate and apply a fourth voltage (e.g., Vpass2 430) to the dummy wordline(s) 360. In one embodiment, the Vpass2 430 voltage is greater than the Vpass 420 voltage. Accordingly, the voltage application component 113 can cause the regulator 225-*b* to increase its output voltage to Vpass2 420. Because the switch 310 is deactivated during time interval 425, the unselected wordline(s) 355 can remain in the floating state at Vpass 420.

During time interval 430, the voltage application component 113 can determine the voltage at the top and bottom dummy wordline(s) 365 are at the fourth voltage (e.g., at Vpass2 430)—e.g., the voltage application component 113 can apply the fourth voltage for a predetermined duration configured to drive the top and bottom dummy wordline(s) 365 to the first voltage. In one embodiment, the voltage application component 113 can deactivate switch 320 after the top and bottom dummy wordline(s) 365 are at the fourth voltage. In one embodiment, the voltage application component 113 can also cause regulator 225-*b* to refrain from applying the fourth voltage—e.g., the voltage regulator 210-*b* can stop applying the fourth voltage after the top and bottom dummy wordline(s) 365 are driven to the Vpass2 430 voltage. In one embodiment, the voltage application component 113 can cause regulator 210-*b* to refrain from applying the third voltage (e.g., regulator voltage 425) after the top and bottom dummy wordline(s) 365 are driven to the fourth voltage. In one embodiment, the voltage application component 113 can continue to cause the voltage regulator 210-*b* to apply the third voltage for read operations at other planes.

In one embodiment, the voltage application component 113 can continue activating switches, deactivating switches, and causing the regulator 225-*b* to apply voltages to the remaining components until the read operation is complete. For example, before, after, or during time intervals 405-425, the voltage application component 113 could cause regulator 210-*a* to apply Vpass1+Vth of Switch 245-*a* to a gate of switch 245-*a* to activate switch 245-*a*. In such embodiments, the voltage application component 113 could also cause switch 315 to be activated and cause regulator 225-*b* to apply the Vpass1 voltage to the dummy wordline(s) 360. In one embodiment, the voltage application component 113 can cause switch 315 to be deactivated after the dummy wordline(s) 360 are driven to the Vpass1 voltage.

In one embodiment, the voltage application component 113 could cause regulator 210-*c* to apply VSGSRV+Vth of Switch 245-*c* to a gate of switch 245-*c* to activate switch 245-*c*. In such embodiments, the voltage application component 113 could also cause switch 325 to be activated and cause regulator 225-*b* to apply the VSGSRV voltage to SGS 370. In one embodiment, the voltage application component 113 can cause switch 325 to be deactivated after the SGS 370 is driven to the VSGSRV voltage.

In one embodiment, the voltage application component 113 could cause regulator 210-*d* to apply VSGDRV+Vth of Switch 245-*d* to a gate of switch 245-*d* to activate switch 245-*d*. In such embodiments, the voltage application component 113 could also cause switch 330 to be activated and cause regulator 225-*b* to apply the VSGDRV voltage to SGD 375. In one embodiment, the voltage application component 113 can cause switch 330 to be deactivated after the SGD 375 is driven to the VSGDRV voltage. In one embodiment, any negative coupling on floating signals (e.g., negative coupling affecting components (e.g., unselected wordline(s) 355) during the read operation) can be recovered by the cascode approach. In one embodiment, any positive coupling on floating signals (e.g., positive coupling affecting components (e.g., unselected wordline(s) 355) during the read operation) can be recovered by firmware or voltage application component 113. For example, the voltage application component 113 can cause the Vpass 420 voltage to be applied to the unselected wordline(s) 355 again if a voltage of unselected wordline(s) 355 is affected by positive coupling.

FIG. 5 is a flow diagram of an example method for implementing global voltage regulators and local voltage regulators for IWL reads, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by local media controller 135 or voltage application component 113 of FIG. 1A. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 505, the processing logic receives a request to perform a memory access operation (e.g., a read operation).

At operation 510, a first voltage is applied to an unselected wordline (e.g., a wordlines coupled to a memory cell not selected for a read operation). For example, the processing logic (e.g., voltage application component 113), coupled to a memory device including a plurality of memory cells residing on one or more planes, causes a first voltage regulator of a first set of voltage regulators (e.g., regulators 215, 220, 225, 230, 235, and 240 as described with reference to FIG. 2) to apply a first voltage (e.g., Vpass as described with reference to FIGS. 3 and 4) to the unselected wordline. In one embodiment, the first set of voltage regulators are voltage regulators dedicated to a plane of the one or more planes (e.g., the first set of voltage regulators are not shared by the one or more planes). In one embodiment, the plane can refer to one or more blocks of memory cells grouped together as a separate partition. In one embodiment, the memory device includes a second set of voltage regulators (e.g., regulators 210 as described with reference to FIG. 2) that are shared by the one or more planes. In some embodiments, the processing logic determines to cause the first voltage to be applied based on a read operation or a voltage threshold of a memory cell. In one embodiment, each voltage regulator of the first set of voltage regulators is coupled to conductive lines (e.g., wordlines, dummy wordlines (e.g., wordlines coupled to memory cells not storing data), or conductive lines coupled to select gate source (SGS) or select gate drain (SGD)) of a first plane of one or more planes in a memory device, where the memory devices comprises the unselected wordline. In one embodiment, the processing logic causes a fifth voltage (e.g., a voltage greater than a threshold voltage of switch 310 plus the first voltage) to be applied to a switch (e.g., switch 310) to couple the first voltage regulator to the unselected wordlines, where causing the first voltage regulator to apply the first voltage to the unselected wordline is responsive to causing the fifth voltage to be applied to the switch. For example, the processing logic can cause the fifth voltage to be applied to the gate of the switch to activate the switch and couple the first voltage regulator to the unselected wordline and then cause the first voltage regulator to apply the first voltage, where a difference between the fifth voltage and the first voltage is greater than a threshold voltage of the switch 310—e.g., the processing logic can determine the fifth voltage by determining a threshold voltage of switch 310 plus the first voltage. In one embodiment, the processing logic causes a third voltage regulator (e.g., voltage regulator 225-*a*) of the first set of voltage regulators to apply a fifth voltage (e.g., a read voltage as described with reference to FIG. 3) to a selected wordline (e.g., a wordline coupled to a memory cell selected for a read operation). In one embodiment, the method 500 is directed to a multi-plane concurrent read operation. In such embodiments, the method 500 can be concurrently applied to each plane of the one or more planes of the memory device—e.g., to each plane 205 as described with reference to FIG. 2.

At operation 515, a second voltage is applied to switch. For example, the processing logic causes the second voltage (e.g., a ground voltage or any voltage less than the threshold voltage of the switch 310) to be applied to the switch (e.g., switch 310) to couple the first voltage regulator and the unselected wordline to isolate the unselected wordline from the first voltage regulator. In one embodiment, the switch is a transistor. In such embodiments, the processing logic can cause the second voltage to be applied such that a difference between the second voltage and a voltage at a source of the transistor is less than a voltage threshold of the transistor—e.g., the processing logic can determine the second voltage by determining a voltage less than the voltage at the source of the transistor plus a voltage threshold of the transistor so that applying the second voltage at the gate causes the transistor to deactivate. In one embodiment, the unselected wordline is in a floating state after being isolated from the first voltage regulator. In at least one embodiment, during the memory access operation (e.g., a memory cell sensing phase), selected block gates in a row path are floating—e.g., wordlines or array row terminals are in a floating state during the memory sensing operation.

At operation 520, a third voltage is applied to a gate of a transistor. For example, the processing logic causes a second voltage regulator (e.g., regulator 210-*b*) of a second set of voltage regulators to apply a third voltage (e.g., Vpass2+Vthswitch 245-*b* as described with reference to FIG. 3) to the gate of a transistor (e.g., switch 245-*b*) coupled to the first voltage regulator and one or more dummy wordlines (e.g., dummy wordlines 365, where the dummy wordline is a wordline coupled to a memory cell not storing data and located a top or bottom of the memory pillar) to couple the first voltage regulator (e.g., regulator 225-*b*) to the one or more dummy wordlines responsive to isolating the unselected wordline from the first voltage regulator—e.g., the processing logic can apply the third voltage to the gate of the transistor after isolating the unselected wordline 355 from the regulator 225-*b*. In some embodiment, the processing logic can determine the third voltage by determining a voltage at the source of the transistor (e.g., the Vpass2 voltage applied to the dummy wordlines 365 as described with reference to FIG. 3) plus a voltage threshold of the transistor (e.g., switch 245-*b*)—e.g., the third voltage is greater than Vpass2 plus the threshold of the switch 245-*b*. In one embodiment, the second set of voltage regulators is shared between the one or more planes.

At operation 525, a fourth voltage is applied to the one or more dummy wordlines. For example, the processing logic causes the first voltage regulator (e.g., regulator 225-*b*) to apply the fourth voltage (e.g., Vpass2 as described with reference to FIG. 3) to the one or more dummy wordlines. In one embodiment, the processing logic can determine the fourth voltage based on a stage of the read operation or threshold voltages of memory cells. In some embodiments, the fourth voltage is greater than the first voltage. In one embodiment, the processing logic causes the second voltage regulator (e.g., regulator 210-*b*) of the second set of voltage regulators to refrain from applying the third voltage to the gate of the transistor to decouple the first voltage regulator and the one or more dummy wordlines responsive to causing the first voltage regulator to apply the fourth voltage—e.g., the processing logic can deactivate the transistor after the one or more dummy wordlines are at the fourth voltage. In some embodiments, the processing logic can apply a voltage that is less than a voltage threshold of the transistor (e.g., switch 245-*b*) and a voltage at the dummy wordlines (e.g., Vpass2). In one embodiment, the processing logic causes a third voltage regulator (e.g., regulator 210-*c*) of the second set of voltage regulators to apply a fifth voltage (e.g., VSGDRV+Vth of Switch 245-*d*) to a gate of a second transistor (e.g., switch 245-*d*) coupled to the first voltage regulator and a select gate drain (SGD) (e.g., SGD 375). In some embodiments, the processing logic can determine the fifth voltage applied to the gate by determining a voltage greater than a voltage threshold of the second transistor (e.g., switch 245-*d*) and a voltage of the SGD 375 (e.g., VSGDRV). In such embodiments, the processing logic causes the first voltage regulator (e.g., regulator 225-*b*) to apply a sixth voltage (e.g., VSGDRV) to the SGD responsive to causing the third voltage regulator of the second set of voltage regulators to apply the fifth voltage—e.g., the processing logic can apply the fifth voltage according to a read operation to the SGD 375 after the switch 245-*d* is activated. In one embodiment, the processing logic causes a third voltage regulator (e.g., voltage regulator 210-*c*) of the second set of voltage regulators to apply a fifth voltage (e.g., VSGSRV+Vth of Switch 245-*c*) to a gate of a second transistor (e.g., switch 245-*c*) coupled to the first voltage regulator and a select gate source (SGS) (e.g., SGS 370). In some embodiments, the processing logic can determine the fifth voltage applied to the gate by determining a voltage greater than a voltage threshold of the second transistor (e.g., switch 245-*c*) and a voltage of the SGS 375 (e.g., VSGSRV). In such embodiments, the processing logic causes the first voltage regulator to apply a sixth voltage (e.g., VSGSRV) to the SGS responsive to causing the third voltage regulator of the second set of voltage regulators to apply the firth voltage—e.g., the processing logic can apply the fifth voltage according to a read operation to the SGS 370 after the switch 245-*c* is activated.

In one embodiment, the method 500 can be performed at a system comprising a memory device comprising a plurality of memory cells residing on one or more planes and a controller configured to perform a memory access operation, coupled to the memory device, the controller including a first set of voltage regulators, wherein each voltage regulator of the first set of voltage regulators is coupled to one or more conductive lines (e.g., wordlines, dummy wordlines, conductive lines coupled to SGS or SGD) to each plane of the one or more planes, where the first set of voltage regulators is shared by the one or more planes. In such embodiments, the system comprises second set of voltage regulators, wherein each voltage regulator of the second set of voltage regulators is coupled to one or more conductive lines of a plane of the one or more planes, where the second set of voltage regulators are exclusive to the plane and configured to supply a respective voltage to the one or more conductive lines during the memory access operation. In one embodiment, the plane of the one or more planes comprises a switch coupled with a first voltage regulator of the first set of voltage regulators, a second voltage regulator of the second set of voltage regulators, and a first conductive line of the one or more conductive lines, where the switch is configured to selectively couple the second voltage regulator of the second set of voltage regulators to the first conductive line of the one or more conductive lines. In one embodiment, the first voltage regulator of the first set of voltage regulators is coupled to a gate of the transistor. In some embodiments, the second voltage regulator of the second set of voltage regulators is coupled to a drain of the transistor. In one embodiment, the first conductive line of the one or more conductive lines is coupled to a source of the transistor. In some embodiments, the first voltage regulator is configured to apply a voltage to the gate of the transistor to couple the second voltage regulator of the second set of voltage regulators to the first conductive line of the one or more conductive lines. In such embodiments, the system comprises a second switch coupled with the switch and the first conductive line of the one or more conductive lines configured to couple the second voltage regulator of the second set of voltage regulators with the first conductive line of the one or more conductive lines.

In some embodiments, a second voltage regulator of the second set of voltage regulators is coupled with a selected wordline of the memory device. In one embodiment, the system further comprises one or more additional switches, where each additional switch of the one or more switches is coupled with a respective conductive line of the one or more conductive lines, and where a gate of each additional switch is coupled to a respective voltage regulator of the first set of voltage regulators. In some embodiments, the one or more conductive lines comprise at least one of an unselected wordline, a dummy wordline, a conductive line coupled with a select gate source (SGS), or a conductive line coupled to a select gate drain (SGD). In at least an embodiment, a number of conductive lines of the one or more conductive lines is greater than a number of voltage regulators of the second set of voltage regulators. In one embodiment, the second voltage regulator of the second set of voltage regulators is configured to supply a first voltage to the first conductive lines of the one or more conductive line and a second voltage to a second conductive line of the one or more conductive lines. In some embodiments, each plane of the one or more planes is coupled with a respective set of second voltage regulators, where each respective second set of voltage regulators is different than the first set of voltage regulators.

Figure 6:
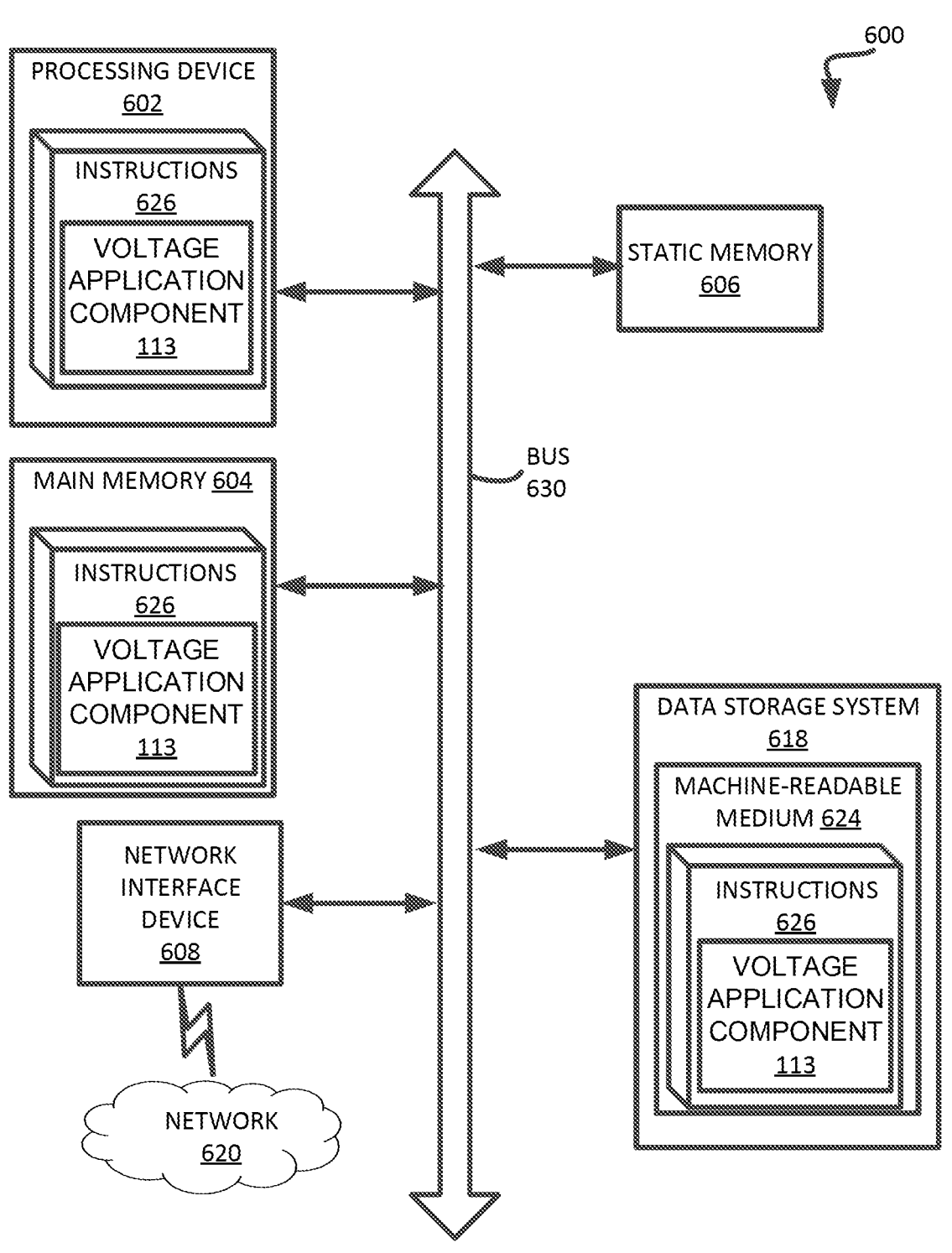
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the voltage application component 113 of FIG. 1 to perform operations). In one embodiment, the voltage application component 113 is configured to cause a voltage to be applied to selected wordlines, unselected wordlines, dummy wordlines, and a select gate drain (SGD) or select gate source (SGS). In one embodiment, the voltage application component 113 can cause a first voltage to be applied to the unselected wordlines. In such embodiments, the voltage application component 113 can cause the unselected wordlines to float (e.g., decouple the unselected wordlines from a voltage source) after the unselected wordlines are at the first voltage. In some embodiments, the voltage application component 113 can then apply a second voltage to the dummy wordlines at a top and bottom of the array as described with reference to FIGS. 3 and 4. In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 404 can correspond to the memory sub-system 110 of FIG. 1.

In one embodiment, the instructions 626 include instructions to implement functionality corresponding to voltage application component 113 to perform a program operation for the processing device 602. While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system, comprising:
a memory device comprising a plurality of memory cells residing on one or more planes;
a first set of voltage regulators, wherein each voltage regulator of the first set of voltage regulators is coupled to one or more conductive lines of each plane of the one or more planes, wherein the first set of voltage regulators is shared by the one or more planes; and
a second set of voltage regulators, wherein each voltage regulator of the second set of voltage regulators is coupled to one or more conductive lines of a plane of the one or more planes, wherein the second set of voltage regulators are exclusive to the plane and configured to supply a respective voltage to one or more conductive lines during a memory access operation;
wherein the plane of the one or more planes comprises a respective switch coupled with a first voltage regulator of the first set of voltage regulators, a second voltage regulator of the second set of voltage regulators, and a first conductive line of the one or more conductive lines, wherein the switch is configured to selectively couple the second voltage regulator of the second set of voltage regulators to the first conductive line of the one or more conductive lines during the memory access operation; and
wherein a number of conductive lines of the one or more conductive lines is greater than a number of voltage regulators of the second set of voltage regulators.

2. The system of claim 1, wherein the second voltage regulator of the second set of voltage regulators is coupled with a selected wordline of the memory device.

3. The system of claim 1, wherein the switch comprises a transistor and wherein:
the first voltage regulator of the first set of voltage regulators is coupled to a gate of the transistor;
the second voltage regulator of the second set of voltage regulators is coupled to a drain of the transistor; and
the first conductive line of the one or more conducive lines is coupled to a source of the transistor.

4. The system of claim 3, wherein the first voltage regulator is configured to:
apply a voltage to the gate of the transistor to couple the second voltage regulator of the second set of voltage regulators to the first conductive line of the one or more conductive lines during the memory access operation.

5. The system of claim 4, wherein the system further comprises a second switch coupled with the switch and the first conductive line of the one or more conductive lines configured to couple the second voltage regulator of the second set of voltage regulators with the first conductive line of the one or more conductive lines.

6. The system of claim 1, wherein the system further comprises one or more additional switches, wherein each additional switch of the one or more switches is coupled with a respective conductive line of the one or more conductive line, and wherein a gate of each additional switch is coupled to a respective voltage regulator of the first set of voltage regulators.

7. The system of claim 1, wherein the one or more conductive lines comprise at least one of a unselected wordline, a dummy wordline, a conductive line coupled with a select gate source (SGS), or a conductive line coupled with a select gate drain (SGD).

8. The system of claim 1, wherein the second voltage regulator of the second set of voltage regulators is configured to supply a first voltage to the first conductive line of the one or more conductive lines and a second voltage to a second conductive line of the one or more conductive line.

9. The system of claim 1, wherein each plane of the one or more planes is coupled with a respective set of second voltage regulators, wherein each respective second set of voltage regulators is different than the first set of voltage regulators.

10. A method comprising:
receiving, by a processing device coupled to a memory device, a request to perform a memory access operation;
causing, by the processing device, a first voltage regulator of a first set of voltage regulators to apply a first voltage to an unselected wordline of the memory access operation responsive to receiving the memory access operation;
causing, by the processing device, a second voltage to be applied to a switch coupled to the first voltage regulator and the unselected wordline to isolate the unselected wordline from the first voltage regulator;

causing, by the processing device, a second voltage regulator of a second set of voltage regulators to apply a third voltage to a gate of a transistor to couple the first voltage regulator to the one or more dummy wordlines, wherein the transistor is coupled to the first voltage regulator and one or more dummy wordlines; and causing, by the processing device, the first voltage regulator to apply a fourth voltage to the one or more dummy wordlines responsive to coupling the first voltage regulator to the one or more dummy wordlines.

11. The method of claim 10, wherein each voltage regulator of the first set of voltage regulators is coupled to conductive lines of a first plane of one or more planes of the memory device and each voltage regulator of the second set of voltage regulators is coupled to gates of one or more transistors of the first plane, wherein the second set of voltage regulators are shared between the one or more planes.

12. The method of claim 10, further comprising:

causing, by the processing device, a fifth voltage to be applied to the switch to couple the first voltage regulator to the unselected wordlines, wherein causing the first voltage regulator to apply the first voltage to the unselected wordline is responsive to causing the fifth voltage to be applied to the switch.

13. The method of claim 10, further comprising:

causing, by the processing device, the second voltage regulator of the second set of voltage regulators to refrain from applying the third voltage to the gate of the transistor to decouple the first voltage regulator and the one or more dummy wordlines responsive to causing the first voltage regulator to apply the fourth voltage.

14. The method of claim 13, further comprising:

causing, by the processing device, a third voltage regulator of the second set of voltage regulators to apply a fifth voltage to a gate of a second transistor coupled to the first voltage regulator and a select gate drain (SGD); and causing, by the processing device, the first voltage regulator to apply a sixth voltage to the SGD responsive to causing the third voltage regulator of the second set of voltage regulators to apply the fifth voltage.

15. The method of claim 13, further comprising:

causing, by the processing device, a third voltage regulator of the second set of voltage regulators to apply a fifth voltage to a gate of a second transistor coupled to the first voltage regulator and a select gate source (SGS); and causing, by the processing device, the first voltage regulator to apply a sixth voltage to the SGS responsive to causing the third voltage regulator of the second set of voltage regulators to apply the firth voltage.

16. The method of claim 10, further comprising:

causing, by the processing device, a third voltage regulator of the first set of voltage regulators to apply a fifth voltage to a selected wordline.

17. A computer-readable non-transitory storage medium comprising executable instructions that, when executed by a processing device, cause the processing device to perform operations, comprising:

receiving a request associated with a memory access operation;

causing a first voltage regulator of a first set of voltage regulators to apply a first voltage to an unselected wordline of the memory access operation responsive to receiving the memory access operation;

causing a second voltage to be applied to a switch coupled to the first voltage regulator and the unselected wordline to isolate the unselected wordline from the first voltage regulator;

causing a second voltage regulator of a second set of voltage regulators to apply a third voltage to a gate of a transistor to couple the first voltage regulator to the one or more dummy wordlines, wherein the transistor is coupled to the first voltage regulator and one or more dummy wordlines; and causing the first voltage regulator to apply a fourth voltage to the one or more dummy wordlines responsive to coupling the first voltage regulator to the one or more dummy wordlines.

18. The computer-readable non-transitory storage medium of claim 17, wherein the first set of voltage regulators is associated with a first plane of one or more planes of a memory device and the second set of voltage regulators is shared between the one or more planes.

19. The computer-readable non-transitory storage medium of claim 17, further comprising executable instructions that, when executed by the processing device, cause the processing device to perform operations, comprising:

causing the second voltage regulator of the second set of voltage regulators to refrain from applying the third voltage to the gate of the transistor to decouple the first voltage regulator and the one or more dummy wordlines responsive to causing the first voltage regulator to apply the fourth voltage.

* * * * *